United States Patent
Tanino

[11] Patent Number: 6,153,165
[45] Date of Patent: Nov. 28, 2000

[54] SINGLE CRYSTAL AND METHOD OF PRODUCING THE SAME

[75] Inventor: Kichiya Tanino, Sanda, Japan

[73] Assignee: Nippon Pillar Packing Co., Ltd., Osaka, Japan

[21] Appl. No.: 09/147,456

[22] PCT Filed: May 20, 1998

[86] PCT No.: PCT/JP98/02197

§ 371 Date: Dec. 29, 1998

§ 102(e) Date: Dec. 29, 1998

[87] PCT Pub. No.: WO98/53125

PCT Pub. Date: Nov. 26, 1998

[30] Foreign Application Priority Data

May 23, 1997 [JP] Japan .................................. 9-170902

[51] Int. Cl.$^7$ .............................. L30B 1/04; L30B 29/36
[52] U.S. Cl. .............................. 423/345; 117/4; 117/7; 117/9; 117/951
[58] Field of Search ................... 117/4, 7, 9, 84, 117/87, 88, 951; 428/620, 446; 423/345

[56] References Cited

U.S. PATENT DOCUMENTS

| | | | |
|---|---|---|---|
| 4,590,130 | 5/1986 | Cline | 428/446 |
| 5,471,946 | 12/1995 | Scholz et al. | 117/84 |
| 6,053,973 | 4/2000 | Tanino et al. | 117/4 |

*Primary Examiner*—Benjamin L. Utech
*Assistant Examiner*—Donald L. Champagne
*Attorney, Agent, or Firm*—Jones, Tullar & Cooper, P.C.

[57] ABSTRACT

According to the present invention, a complex (M) which is formed by growing a polycrystalline β-SiC plate 2 on the surface of a single crystal α-SiC base material 1 by the thermal CVD method is heat-treated at a high temperature of 1,900 to 2,400° C., whereby polycrystals of the polycrystalline cubic β-SiC plate are transformed into a single crystal, so that the single crystal is oriented in the same direction as the crystal axis of the single crystal α-SiC base material and integrated with the single crystal of the single crystal α-SiC base material to be largely grown. As a result, single crystal SiC of high quality which has a very reduced number of lattice defects and micropipe defects can be efficiently produced while ensuring a sufficient size in terms of area.

11 Claims, 3 Drawing Sheets

SINGLE CRYSTAL AND METHOD OF PRODUCING THE SAME

CROSS REFERENCE TO RELATED APPLICATION

This application discloses subject matter in common with application Ser. No. 09/147,620, filed Feb. 3, 1999.

TECHNICAL FIELD

The present invention relates to single crystal SiC and a method of producing the same, and more particularly to single crystal SiC which is used as a substrate wafer for a light-emitting diode and an electronic device, or the like, and also to a method of producing the same.

BACKGROUND ART

SiC (silicon carbide) is superior in heat resistance and mechanical strength, and also has good resistance to radiation. In addition, it is easy to perform valence control of electrons and holes by doping an impurity. Moreover, SiC has a wide band gap (for example, single crystal 6H-SiC has a band gap of about 3.0 eV, and single crystal 4H-SiC has a band gap of 3.26 eV). Therefore, it is possible to realize a large capacity, high frequency, high dielectric strength, and high environmental resistance which cannot be realized by existing semiconductor materials such as Si (silicon) and GaAs (gallium arsenide). For these reasons, single crystal SiC is receiving attention and is expected as a semiconductor material for a next-generation power device.

As a method of growing (producing) single crystal SiC of this type, known are a method in which single crystal SiC is grown by a sublimation and recrystallization method using a seed crystal, and that in which, in the case of a high temperature, epitaxial growth is conducted on a silicon substrate by using a chemical vapor deposition method (CVD method), thereby growing single crystal cubic SiC (β-SiC).

In the above-described conventional production methods, however, the crystal growth rate is as low as 1 μm/hr. Furthermore, the sublimation and recrystallization method has a problem in that pin holes which have a diameter of several microns and which pass through the crystal in the growing direction remain at about 100 to 1,000/cm$^2$ in a growing crystal. Such pin holes are called micropipe defects and cause a leakage current when a semiconductor device is fabricated. These problems block a practical use of single crystal SiC which has superior characteristics as compared with other existing semiconductor materials such as Si and GaAs as described above.

In the case of the high-temperature CVD method, the substrate temperature is as high as 1,700 to 1,900° C., and it is required to produce a high-purity reducing atmosphere. Therefore, the method has a problem in that it is difficult to conduct the method from the view point of installation. Furthermore, the method has another problem in that, because of epitaxial growth, the growth rate is naturally limited.

SUMMARY OF THE INVENTION

It is an object of the present invention to provide single crystal SiC of a high quality in which lattice defects and micropipe defects are largely reduced by conducting a high-temperature heat treatment, and a production method in which the growth rate of the single crystal SiC is enhanced so that the area of the single crystal is sufficiently ensured, and which can expedite the practical use of the single crystal as a semiconductor material.

The single crystal SiC of the present invention is characterized in that a complex in which a polycrystalline plate consisting of Si and C atoms is stacked on the surface of a single crystal SiC base material and is subjected to a heat treatment, whereby polycrystals of the polycrystalline plate are transformed into a single crystal and the single crystal oriented in the same direction as the crystal axis of the single crystal base material is grown.

According to the thus configured present invention, the complex consisting of the single crystal SiC base material and the polycrystalline plate stacked on the surface of the base material is subjected to a heat treatment at a high temperature, whereby polycrystals of the polycrystalline plate are phase-transformed while external impurities are prevented from entering between the single crystal SiC base material and the polycrystalline plate, and the crystal is oriented in the same direction as the crystal axis of the single crystal SiC base material and is integrated with the single crystal of the base material, thereby enabling a single crystal of high quality which has a reduced number of lattice defects and micropipe defects, to be grown largely in terms of area. As a result, it is possible to attain the effect of expediting the practical use of a single crystal SiC which is superior in a large capacity, a high frequency, a high dielectric strength, and a high environmental resistance to existing semiconductor materials such as Si (silicon) and GaAs (gallium arsenide) and which is expected as a semiconductor material for a power device.

The method of producing single crystal SiC of the present invention is characterized in that a polycrystalline plate consisting of Si and C atoms is stacked on the surface of a single crystal SiC base material, the complex is then subjected to a heat treatment to transform polycrystals of the polycrystalline plate into a single crystal, whereby a single crystal oriented in the same direction as the crystal axis of the single crystal SiC base material is integrally grown.

Also the thus configured present invention can attain the same effects as those of the first variant of the present invention that single crystal SiC of high quality which has a reduced number of lattice defects and micropipe defects is grown easily and efficiently so as to ensure a large size in terms of area and quantity, and that single crystal SiC which is available as a semiconductor material having a very high performance can be stably produced and supplied on an industrial scale.

In the method of producing single crystal SiC of the present invention, when the polycrystalline plate constituting the complex is a polycrystalline β-SiC plate grown on the surface of a single crystal SiC base material by the thermochemical vapor deposition and the thermochemical vapor deposition temperature of the polycrystalline β-SiC plate is set to be in the range of 1,300 to 1,900° C., the present invention attains an effect that single crystal SiC of high purity and high quality which has a reduced number of lattice defects and micropipe defects can be obtained, while surppressing the entering of impurities between the single crystal SiC base material and the polycrystalline plate on the surface thereof, and diffusion of the impurities.

DETAILED DESCRIPTION OF THE PREFERRED EMBODIMENT

Figure 1:
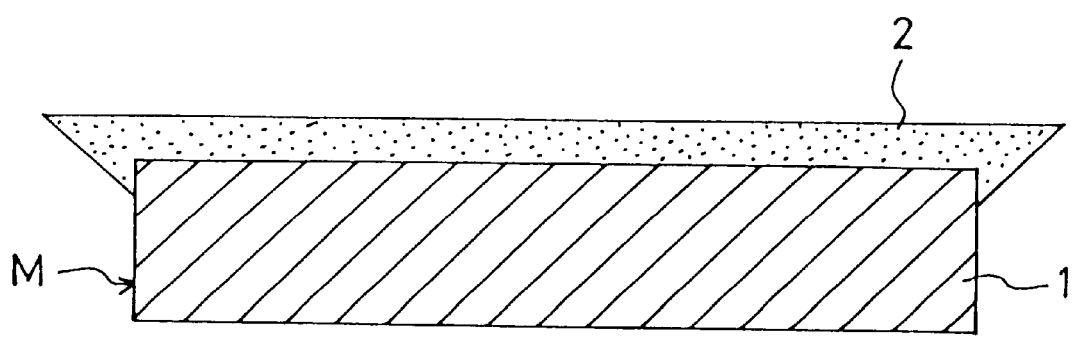
FIG. 1 is a diagram showing a complex before the single crystal SiC of the present invention is heat-treated.
Figure 2:
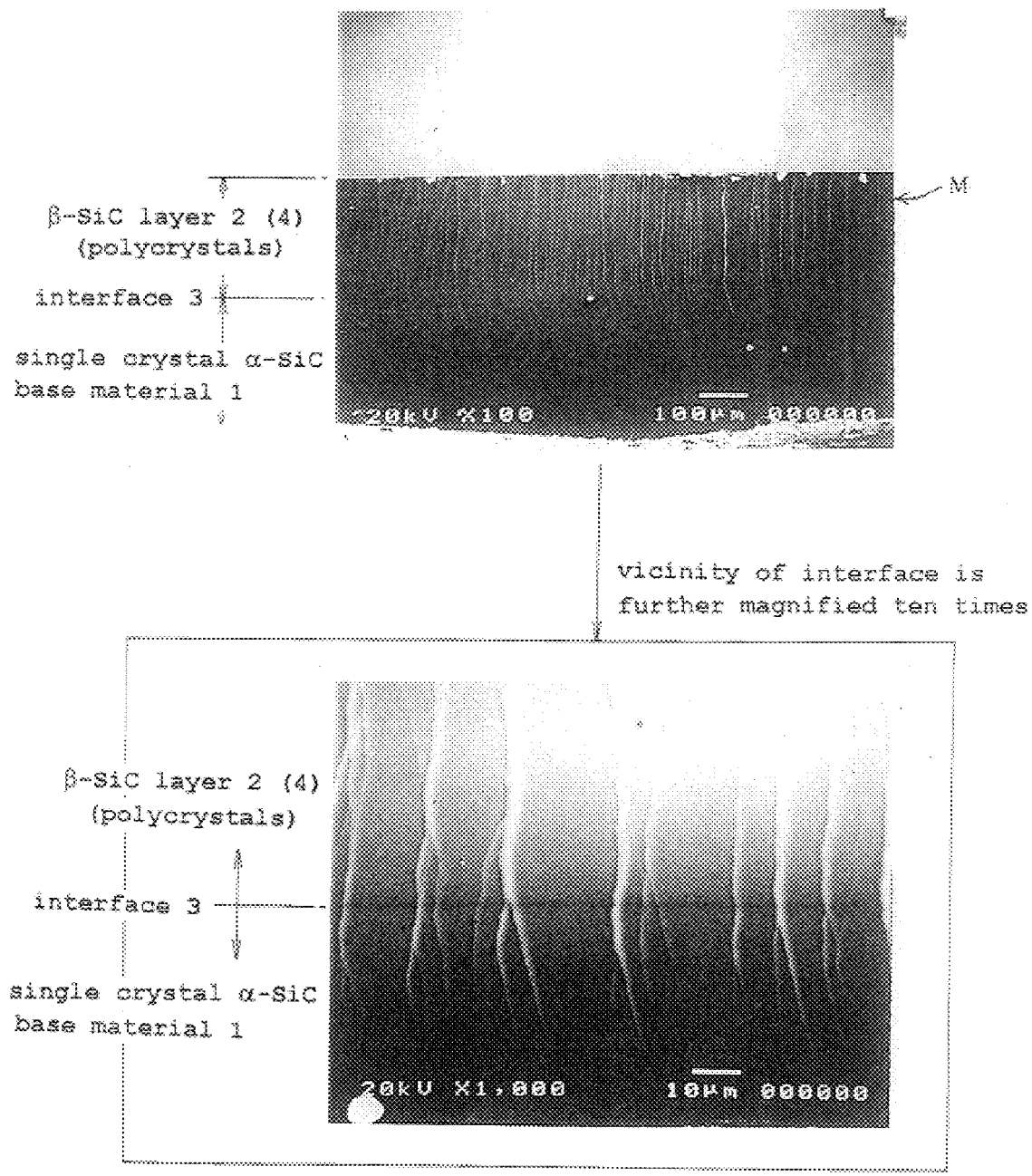
FIG. 2 is a microphotograph of an enlarged view of a main portion before the single crystal SiC of the present invention is heat-treated.

Hereinafter, an embodiment of the present invention will be described. FIG. 1 diagrammatically shows a complex M before single crystal SiC is heat-treated. The complex M is formed by growing a polycrystalline cubic β-SiC plate 2 on the surface of a single crystal hexagonal α-SiC base material 1 (6H type or 4H type) by the thermochemical vapor deposition method (hereinafter, referred to as the thermal CVD method) in the temperature range of 1,300 to 1,900° C. As clearly shown in a microphotograph of an etched section of FIG. 2, in the stage of growing the polycrystalline β-SiC plate 2, polycrystals 4 of the polycrystalline β-SiC plate 2 are grown on the surface of the single crystal α-SiC base material 1 containing lattice defects, and the single crystal α-SiC base material 1 and the polycrystalline β-SiC plate 2 contact each other at crystal faces of different crystal forms so as to show a clear linear interface 3.

Thereafter, the whole of the complex M is heat-treated in a saturated SiC vapor pressure and in a temperature range of 1,900 to 2,400° C., preferably 2,000 to 2,200° C. As a result, polycrystals 4 of the polycrystalline β-SiC plate 2 are phase-converted into α-SiC, oriented in the same direction as the crystal axis of the single crystal α-SiC base material 1, and integrated with the single crystal of the single crystal α-SiC base material 1, so that a large single crystal 5 is grown.

Figure 3:
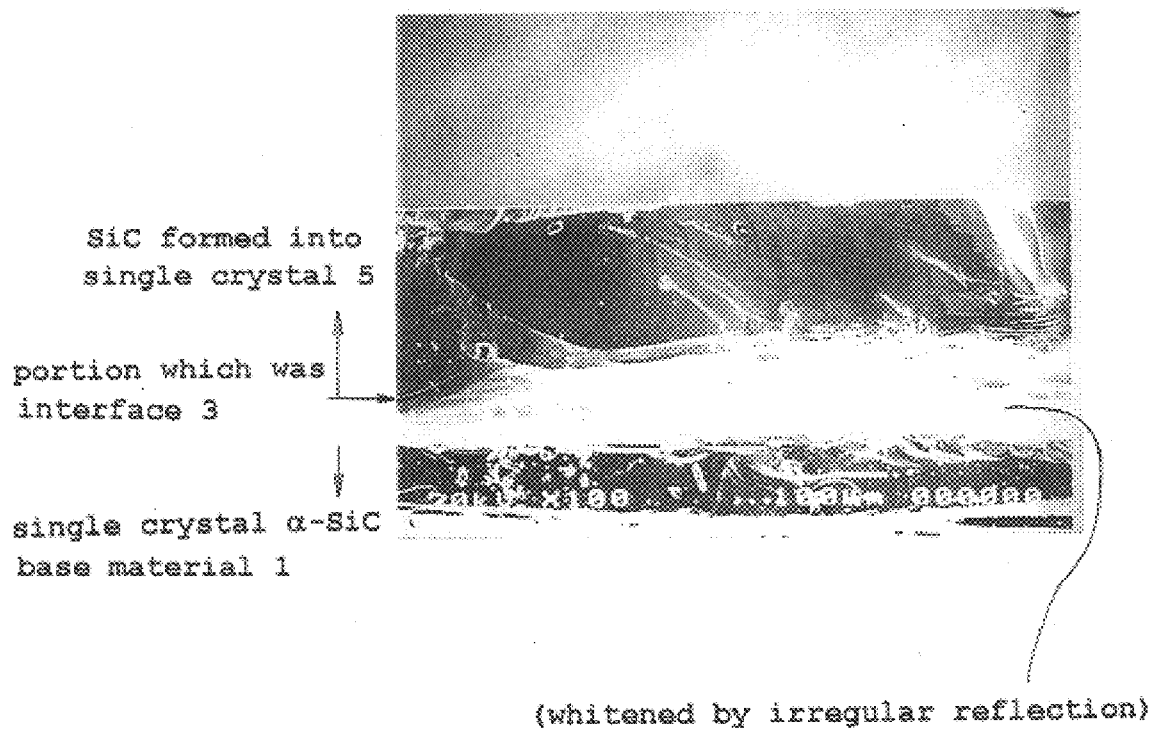
FIG. 3 is a microphotograph showing an enlarged view of a main portion after the single crystal SiC of the present invention is heat-treated.

When the complex M in which polycrystals 4 of the polycrystalline β-SiC plate 2 are formed on the surface of the single crystal α-SiC base material 1 by the thermal CVD method is subjected to a heat treatment as described above, crystal growth mainly consisting of solid-phase growth, such as lattice vibration occurs in the interface 3 to change the atom arrangement. As a result, as clearly shown in a microphotograph of an etched section of FIG. 3, single crystal SiC of high quality which is substantially free from lattice defects and micropipe defects (10 or less per 1 cm$^2$) can be produced in a state where a sufficiently large size is ensured also in terms of area.

In the embodiment, the single crystal α-SiC base material 1 is used as the single crystal SiC base material. Alternatively, for example, an α-SiC sintered member or a single crystal β-SiC member may be used. In the embodiment, the polycrystalline cubic β-SiC plate 2 which is grown on the surface of the single crystal α-SiC base material 1 by thermal CVD is used as the polycrystalline plate. Alternatively, for example, a polycrystalline cubic α-SiC plate, an SiC sintered member of high purity, or an amorphous plate of high purity ($10^{14atm}$/cm$^3$ or less) may be used, and it is possible to obtain single crystal SiC of high quality in the same manner as the embodiment.

As the single crystal α-SiC base material 1 in the embodiment, either of the 6H type or the 4H type may be used. When the 6H type is used, a single crystal which is converted from polycrystals of the polycrystalline β-SiC plate 2 into α-SiC as the progress of the heat treatment is easily grown in the same form as that of a single crystal of the 6H type. When the single crystal base material 1 of the 4H type is used, a single crystal in the same form as that of a single crystal of the 4H type is easily converted and grown.

Preferably, the temperature conditions of the heat treatment of the complex M are set to be 1,900 to 2,400° C., and the process time period is 1 to 3 hours. When the temperature of the heat treatment is lower than 1,900° C., kinetic energy cannot be given to many SiC atoms constituting the interface. When the temperature is higher than 2,400° C., thermal energy which is very much higher than the decomposition energy of SiC is supplied and crystals of SiC themselves are decomposed.

As described above, the present invention discloses a technique that a complex in which a polycrystalline plate consisting of Si and C atoms is stacked on the surface of a single crystal SiC base material is subjected to a heat treatment, so that a single crystal oriented in the same direction as the crystal axis of the single crystal SiC base material is integrally grown to a large size, whereby a single crystal of high quality which is superior in heat resistance and mechanical strength and which can realize a large capacity, high frequency, high dielectric strength, and high environmental resistance that cannot be realized by existing semiconductor materials can be supplied efficiently and stably in terms of area and quantity.

What is claimed is:

1. Single crystal SiC comprising: a single crystal SiC base material defining a crystal axis; and a complex in which a polycrystalline plate consisting of Si and C atoms is stacked on a surface of said single crystal SiC base material, wherein it is subjected to a heat treatment, whereby polycrystals of said polycrystalline plate are transformed into a single crystal, and said single crystal is oriented in the same direction as said crystal axis of said single crystal base material and is grown.

2. Single crystal SiC according to claim 1, wherein said single crystal SiC base material constituting said complex is single crystal α-SiC.

3. Single crystal SiC according to claim 1, wherein said polycrystalline plate constituting said complex is a polycrystalline β-SiC plate which is grown by a thermochemical vapor deposition method on the surface of said single crystal SiC base material.

4. Single crystal SiC according to claim 3, wherein a thermochemical vapor deposition temperature of said polycrystalline β-SiC plate is set to be in a range of 1,300 to 1,900° C.

5. A method of producing single crystal SiC comprising the steps of: stacking a polycrystalline plate consisting of Si and C atoms on a surface of a single crystal SiC base material, forming thereby a complex, the single crystal SiC base material defining a crystal axis, and subjecting the complex to a heat treatment to transform polycrystals of the polycrystalline plate into a single crystal, whereby a single crystal oriented in the same direction as the crystal axis of the single crystal base material is integrally grown.

6. A method of producing single crystal SiC according to claim 5, wherein single crystal α-SiC is used as the single crystal SiC base material constituting the complex.

7. A method of producing single crystal SiC according to claim 5, wherein the polycrystalline plate comprises a polycrystalline β-SiC plate which is grown by a thermochemical vapor deposition method on the surface of the single crystal SiC base material.

8. A method of producing single crystal SiC according to claim 7, wherein a thermochemical vapor deposition temperature of the polycrystalline β-SiC plate is set to be in a range of 1,300 to 1,900° C.

9. A method of producing single crystal SiC according to claim 7, wherein a temperature of the heat treatment of the complex is conducted at a temperature which is higher than a thermochemical vapor deposition temperature in a formation of the polycrystalline plate, and in a saturated SiC vapor pressure.

10. A method of producing single crystal SiC according to claim 9, wherein the temperature of the heat treatment of the complex is 1,900 to 2,400° C.

11. A method of producing single crystal SiC according to claim 9, wherein the temperature of the heat treatment of the complex is 2,000 to 2,200° C.

* * * * *

UNITED STATES PATENT AND TRADEMARK OFFICE
CERTIFICATE OF CORRECTION

PATENT NO.    : 6,153,165
DATED         : November 28, 2000
INVENTOR(S)   : Kichiya Tanino It is certified that error appears in the above-identified patent and that said Letters Patent is hereby corrected as shown below:

Title page,
The title should be -- SINGLE CRYSTAL SIC AND METHOD OF PRODUCING THE SAME --.

Signed and Sealed this

Second Day of October, 2001

*Attest:*

NICHOLAS P. GODICI
*Attesting Officer*      Acting Director of the United States Patent and Trademark Office